United States Patent [19]

Oguino et al.

[11] Patent Number: 4,897,581
[45] Date of Patent: Jan. 30, 1990

[54] HORIZONTAL DEFLECTION CIRCUIT

[75] Inventors: Masanori Oguino; Takeo Yamada; Miyuki Ikeda, all of Yokohama, Japan

[73] Assignee: Hitachi, Ltd., Tokyo, Japan

[21] Appl. No.: 296,824

[22] Filed: Jan. 13, 1989

[30] Foreign Application Priority Data

Jan. 22, 1988 [JP] Japan .................. 63-10692

[51] Int. Cl.$^4$ .................. H01J 29/70; H01J 29/76
[52] U.S. Cl. .................................. 315/408
[58] Field of Search ................. 315/408, 399

[56] References Cited

U.S. PATENT DOCUMENTS 3,769,542 10/1973 Pieters .
4,227,123 10/1980 Dietz .................... 315/408

Primary Examiner—Theodore M. Blum
Attorney, Agent, or Firm—Antonelli, Terry & Wands

[57] ABSTRACT

A horizontal deflection circuit which including a horizontal output transistor; a damper diode connected in parallel with the horizontal output transistor; a resonant capacitor connected in parallel with the damper diode; a horizontal deflection coil connected in parallel with the horizontal output transistor; and a series resonant circuit connected in parallel with the resonant capacitor. The series resonant circuit is constituted by a series connection of a capacitor and an inductor to perform composite resonance in cooperation with the resonant capacitor. The capacitor and the inductor of the series resonant circuit are designed to have a tertiary resonant frequency. The composite resonance by means of the series resonant circuit and the resonant capacitor enables the top of the flyback pulse to be flattened, so that the waveform of the flyback pulse becomes near the form of rectangular wave. Accordingly, a horizontal deflection circuit having higher retracing capacity can be provided through the same horizontal output transistor as generally used in the prior art.

3 Claims, 3 Drawing Sheets

HORIZONTAL DEFLECTION CIRCUIT

BACKGROUND OF THE INVENTION

The present invention relates to a horizontal deflection circuit used in a display unit provided with a CRT.

In general, a resonant circuit in a horizontal deflection output portion of a conventional display unit includes a single tuned resonant circuit composed of a horizontal deflection coil and a resonant capacitor. In the resonant circuit, a retrace period (flyback period) $T_{ret}$ is shown as the half of a resonant period, that is $$\pi \sqrt{L_1 C_1},$$

where $L_1$ represents the inductance of the horizontal deflection coil and $C_1$ represents the capacitance of the resonant capacitor. Further, when a deflection current at the time of scanning the right end of a screen is represented by $i_1$ and the peak value of a flyback pulse voltage generated between both ends of the deflection coil during the retract period is represented by $V_{op}$, the following relation is established.

$$V_{0p} \approx \sqrt{\frac{L_1}{C_1}} i_1 \quad (1)$$

Here attention is directed to the figure of merit (FM) as defined by the following equation (2).

$$FM = \frac{2L_1 i_1}{V_{0p} \times T_{ret}} \quad (2)$$

$$\approx \frac{2L_1 i_1}{\sqrt{\frac{L_1}{C_1}} i_1 \pi \sqrt{L_1 C_1}} = \frac{2}{\pi} \quad (3)$$

The numerator in the equation (2) shows the change of total magnetic flux required for shifting the electron beam of the CRT from the right end of the screen to the left end of the same. The denominator in the equation (2) shows the product of the pulse voltage and the retrace period.

If the waveform of the flyback pulse is a perfectly square waveform, the value of the equation (2) must be equal to 1. However, in fact, the waveform of the flyback pulse is a waveform having half a cycle of a sine curve. Accordingly, as shown in the equation (3), it is quite natural that the value of the equation becomes smaller than 1 (that is, 0.64).

When the figure of merit (FM) is small, it is necessary that the peak voltage of the flyback pulse is increased to attain the same quantity of total flux change. However, expensive parts having characteristics such as durability against high voltage must be used for the horizontal output transistor, the damper diode and other parts of the horizontal deflection circuit for the purpose of increasing the peak voltage of the flyback pulse. If parts inferior in the characteristic thereof is used, the circuit thus constituted by the parts has so little play in it that stable horizontal deflection cannot be carried out as factors such as temperature are changed. If it is possible to bring the figure of merit (FM) closer to the ideal value 1 (one), parts not having such characteristics can be used for the horizontal deflection circuit for performing stable horizontal deflection with satisfactory retrace capacity. The circuit constituted by such inexpensive parts can be employed widely for various CRTs.

SUMMARY OF THE INVENTION

It is therefore an object of the present invention to provide a horizontal deflection circuit in which the figure of merit (FM) is brought closer to the ideal value 1 (one).

It is another object of the invention to provide a horizontal deflection circuit which shows larger retrace capacity in the case where parts, such as a horizontal output transistor and a damper diode, having the same durability against a high voltage as in the prior art, are used in the circuit.

The foregoing and other objects of the invention are substantially attained by a horizontal deflection circuit which comprises: a horizontal output transistor; a damper diode cionnected in parallel with the horizontal output transistor; a resonant capacitor connected in parallel with the damper diode; a horizontal deflection coil connected in parallel with the horizontal output transistor; and a series resonant circuit formed by the series arrangement of a capacitor and an inductor and connected in parallel with the resonant capacitor to perform composite resonance in combination with the resonant capacitor.

The top of the flyback pulse is flattened by the composite resonance due to the series resonant circuit and the resonant capacitor, so that the figure of merit (FM) is brought closer to the ideal value 1.

BRIEF DESCRIPTION OF THE DRAWINGS

Other features and advantages of the present invention will be apparent from the following description taken in connection with the accompanying drawings, wherein.

DESCRIPTION OF THE PREFERRED EMBODIMENTS

Figure 1:
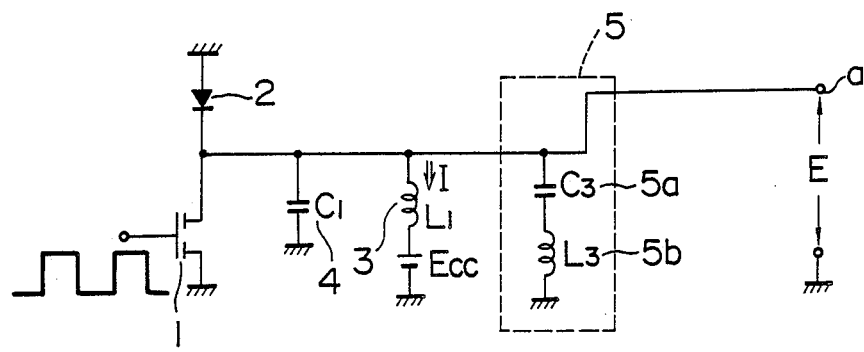
FIG. 1 is a circuit diagram showing a first embodiment of the present invention.

Referring to FIG. 1, a horizontal deflection circuit as a first embodiment of the present invention will be described. The circuit has a horizontal output transistor 1, a damper diode 2, a horizontal deflection coil 3 and a resonant capacitor 4. The arrangement of the circuit as described above is the same as that of the prior art type horizontal deflection circuit. Although FIG. 1 shows the case where the transistor 1 is of an MOS type, it is a matter of course that the invention can be applied to the case where the transistor 1 is of a bipolar type.

The horizontal deflection circuit according to the present invention further has a series resonant circuit 5 as surrounded by the dotted line in FIG. 1. The series resonant circuit has a capacitor 5a ($C_3$) and an inductor 5b ($L_3$).

The horizontal output transistor 1 operates as a switching means in reponse to a pulse signal fed to the gate (base) thereof.

With the switching operation of the horizontal output transistor 1, a flyback pulse is generated across the resonant capacitor 4 ($C_1$). In the case where the series resonant circuit 5 is not connected, the waveform of the flyback pulse is identified by the curve 7b in FIG. 2. In the case of the present invention where the series resonant circuit 5 is connected in parallel with the resonant capacitor 4, composite resonance occurs due to the series resonant circuit 5 and the resonant capacitor 4. In this embodiment, the values $C_3$ and $L_3$ of the capacitor 5a and the inductor 5b are determined so that the series resonant circuit 5 serves as a tertiary resonant circuit.

Figure 2:
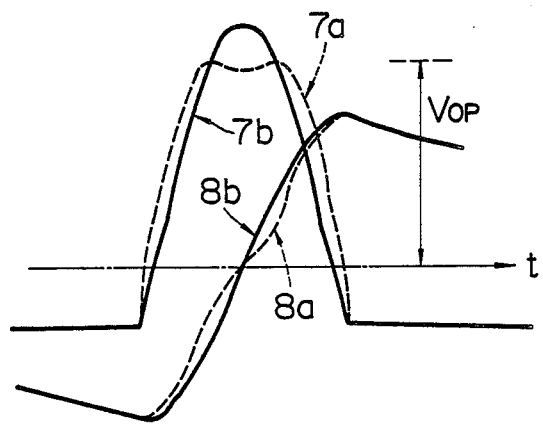
FIG. 2 is a view of waveforms for explaining the operation of the circuit of FIG. 1.

The waveform of the current I flowing in the horizontal deflection coil 3 due to the series resonant circuit 5 is changed from the curve 8b to the curve 8a in FIG. 2.

It is apparent from FIG. 2 that the center portion of the pulse voltage caves in and, accordingly, the peak value $V_{op}$ of the pulse voltage is reduced.

In general, when n is an integer not less than 1 (one), the same effect can be attained by addition of a series resonant circuit for performing resonance to a (4n−1)-th harmonic component. In particular, the case of n=1 corresponds to the aforementioned case. The effect of the present invention is the most remarkable in the case of n=1.

Figure 3:
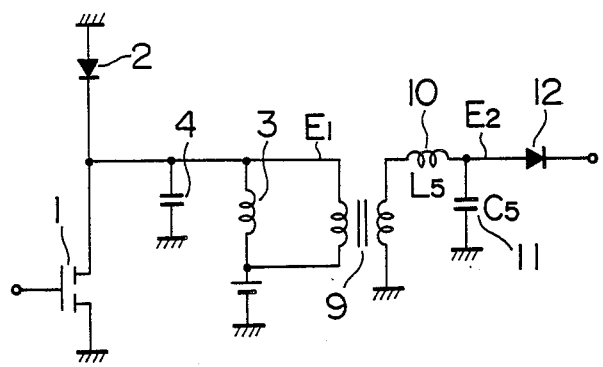
FIG. 3 is a diagram of a prior art horizontal deflection circuit.
Figure 4:
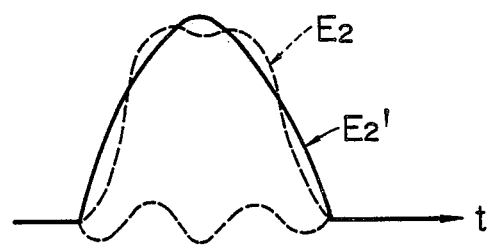
FIG. 4 is a waveform view for explaining the operation of the circuit of FIG. 3.
Figure 5:
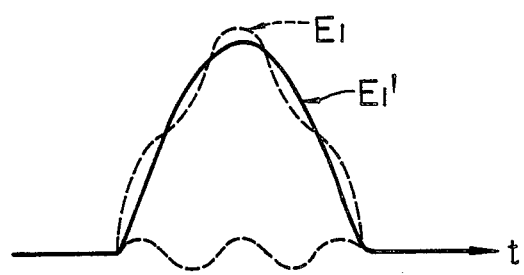
FIG. 5 is also a waveform view for explaining the operation of the circuit of FIG. 3.

As a conventional circuit, a horizontal deflection circuit is disclosed in U.S. Pat. No. 3,769,542. The circuit of the U.S. Pat. No. 3,769,542 and the circuit of the invention are very alike in appearance but quite different in nature. According to the U.S. Pat. No. 3,769,542, a rectifier circuit is connected to a secondary winding of a flyback transformer. FIG. 3 shows a simply illustrated circuit equivalent to the circuit of the U.S. Pat. No. 3,769,542. FIG. 4 shows a voltage waveform at the secondary winding of the flyback transformer. FIG. 5 shows a voltage waveform at a primary winding of the flyback transformer.

The parts designated by the numerals 1 to 4 in FIG. 3 correspond to those designated by the same numerals 1 to 4 in FIG. 1. In FIG. 3, the reference numeral 9 designates a flyback transformer, 10 an expression equivalent to the leakage inductance $L_5$ of the flyback transformer, 11 an expression equivalent to the floating capacitor $C_5$, and 12 a high-voltage rectifier diode. The leakage inductance $L_5$ and the floating capacitor $C_5$ are arranged to resonate to a (4n+1)-th harmonic component, not a (4n−1)-th harominic component. In this case, the voltage waveform $E_2$ at the secondary winding is as shown in the waveform view of FIG. 4, in which the top of the pulse in the waveform $E_2$ is lower than the top of the pulse in the prior art waveform $E_2'$, so that high voltage regulation can be improved. However, on the other hand, the voltage waveform $E_1$ at the primary winding of FIG. 3 is as shown in the waveform view of FIG. 5, in which the top of the ulse is heightened or in other words the peak voltage $V_{op}$ is too increased. In the left end of the inductor 10 in the secondary winding side of the flyback transformer, the voltage waveform is similar to the waveform ($E_1$) of FIG. 5. In the right end of the inductor 10, that is to say, in the high-voltage diode side, the voltage waveform is changed to the waveform ($E_2$) of FIG. 4.

Consequently, the aforementioned prior art technique according to the U.S. Pat. No. 3,769,542 is effective for the purpose of improving high-voltage regulation but stands at a disadvantage in respect to durability against a high voltage, of the output transistor. Although the above description has illustrated the case of n=1, the same thing can be said in the case where n is 2 or more.

According to the present invention, a series resonant circuit for resonating to the (4n−1)-th harmonic component, not to the (4n+1)-th harmonic component, is provided in the primary winding side, not in secondary winding side, thus to attain an advantageous construction in respect to durability against a high voltage. Further, according to the present invention, a flyback transformer may be connected between a terminal a shown in the right end of FIG. 1 and the ground in addition to the basic construction of the present invention as shown in FIG. 1. In this case, the invention has also an advantage in that not only pulse width in horizontal output transistor side can be reduced but high-voltage regulation can be improved.

Returning the subject to the basic construction of FIG. 1, the effect of the present invention will be analyzed quantitatively. Let the initial current flowing in the deflection coil $L_1$ be I ($= -i_1$), in the case where the origin of the time (t=0) is established to correspond to the right end of a screen. It is assumed that a retracing operation starts in response to the switching-off of the output transistor just after the initial current is passed through. Further, it is assumed that the initial energy of the tertiary resonant circuit of $L_3$ and $C_3$ is zero.

Figure 6:
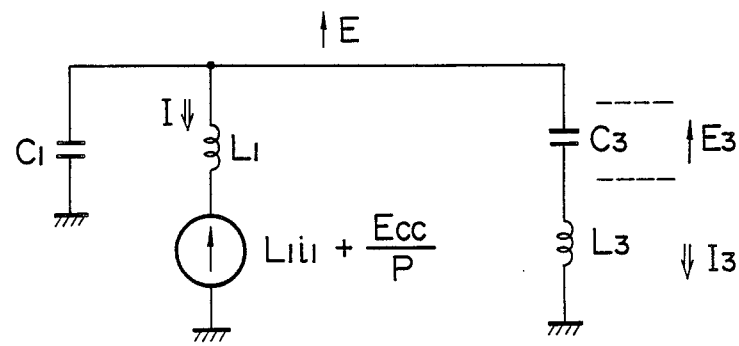
FIG. 6 is a diagram of a circuit equivalent to the circuit of FIG. 1.

On the aforementioned assumption, details of retrace process can be elucidated by analyzing the circuit of FIG. 6 equivalent to the circuit of FIG. 1. In FIG. 6, P is an operator whichis defined as $P=j\omega$ where $\omega$ represents an angular frequency.

In accordance with the Norton's theorem, the voltage E is obtained as follows.

$$E = \frac{\frac{L_1 i_1 + \frac{E_{cc}}{P}}{PL_1}}{PC_1 + \frac{1}{PL_1} + \frac{1}{PC_3 + \frac{1}{PC_3}}} \qquad (4)$$

$$= \frac{L_1 i_1 (1 + \tau_3^2 P^2)\left(1 + \frac{E_{cc}}{PL_1 i_1}\right)}{1 + (\tau_1^2 + \tau_{13}^2 + \tau_3^2)P^2 + \tau_1^2 \tau_3^2 P^4}$$

where $$\begin{cases} \tau_1^2 = L_1 C_1 \\ \tau_3^2 = L_3 C_3 \\ \tau_{13}^2 = L_1 C_3 \end{cases}$$

Let roots in the equation (4) be represented by the following equation (4)' in the case where the denominator is zero.

$$P^2 = -\frac{1}{\tau_a^2}, -\frac{1}{\tau_b^2} \qquad (4)'$$

Let the former correspond to the fundamental wave. Let the latter correspond to the tertiary wave.

$$\tau_a \approx 3\tau_b \tag{5}$$

In accordance with the given definition for the operator P, the equation (4) can be rewritten to a function of time as follows.

$$\frac{E(t)}{L_1 i_1} = \frac{\left(1 - \frac{\tau_3^2}{\tau_a^2}\right)\left\{\sin\left(\frac{t}{\tau_a} - \phi_a\right) + \sin\phi_a\right\}}{\tau_a\left(1 - \frac{\tau_b^2}{\tau_a^2}\right)\cos\phi_a} + \frac{\left(1 - \frac{\tau_3^2}{\tau_b^2}\right)\left\{\sin\left(\frac{t}{\tau_b} - \phi_b\right) + \sin\phi_b\right\}}{\tau_b\left(1 - \frac{\tau_a^2}{\tau_b^2}\right)\cos\phi_b} \tag{6}$$

where $$\begin{cases} \phi_a = \tan^{-1}\frac{E_{cc}\tau_a}{L_1 i_1} \\ \phi_b = \tan^{-1}\frac{E_{cc}\tau_b}{L_1 i_1} \end{cases} \tag{7}$$

In the case of $C_3 = 0$, the resonance as a result shows single resonance. Let the voltage in the single resonance be $E_0$.

$$\frac{E_0(t)}{L_1 i_1} = \frac{\sin\left(\frac{t}{\tau_1} - \phi_1\right) + \sin\phi_1}{\tau_1 \cos\phi_1} \tag{8}$$

where $$\phi_1 + \tan^{-1}\frac{E_{cc}\tau_1}{L_1 i_1} \tag{9}$$

It is apparent from the equations (6) and (8) that the values of the equations take 0 in the case of $t=0$. When the retrace period is represented by $T_{ret}$, the following solution can be obtained from the equation (8) because $E(T_{ret})=0$ and $E_0(T_{ret})=0$.

$$\frac{T_{ret}}{\tau_1} = \pi + 2\phi_1 \tag{10}$$

As indefinite number of solutions can be obtained from the equation (6). Let each term in the right side of the equation (6) be zero, then the following solutions are obtained as a sufficient condition.

$$\begin{cases} \frac{T_{ret}}{\tau_a} = \pi + 2\phi_a \\ \frac{T_{ret}}{\tau_b} = 3\pi + 2\phi_b \end{cases} \tag{11}$$

Now considering the physical meaning of each term in the right side of the equation (6), the first term means resonance for the fundamental wave and the second term means resonance for the tertiary wave. If the term related to the resonance for the tertiary wave takes zero in $t = T_{ret}$, energy remaining in $C_3$ and $L_3$ may be eliminated at the point of time when the retracing operation is terminated. If the energy is eliminated, at least the second term in the equation (6) becomes zero.

In fact, the proposition that the equation (11) is a condition for elimination of the energy can be demonstrated as follows.

Let $I_3$ be the current flowing in $L_3$ of FIG. 3 and let $E_3$ be the potential difference between both ends of $C_3$ of FIG. 3, then $I_3$ and $E_3$ can be calculated as follows. (The process of calculation is omitted.)

$$I_3 = \frac{E}{PL_3 + \frac{1}{PC_3}} \tag{12}$$

$$\therefore \frac{I_3}{L_1 i_1} = \frac{C_3 \cos\left(\frac{t}{\tau_a} - \phi_a\right)}{(\tau_a^2 - \tau_b^2)\cos\phi_a} - \frac{C_3 \cos\left(\frac{t}{\tau_b} - \phi_b\right)}{(\tau_a^2 - \tau_b^2)\cos\phi_b}$$

Rearranging the equation (12) by substituting the equation (11) thereinto, the following equation is obtained.

$$I_3(T_{ret}) = 0$$

On the other hand, $$E_3 = \frac{I_3}{PC_3} \tag{13}$$

$$\therefore \frac{E_3}{L_1 i_1} = \frac{\tau_a\left\{\sin\left(\frac{t}{\tau_a} - \phi_a\right) + \sin\phi_a\right\}}{(\tau_a^2 - \tau_b^2)\cos\phi_a} - \frac{\tau_b\left\{\sin\left(\frac{t}{\tau_b} - \phi_b\right) + \sin\phi_b\right\}}{(\tau_a^2 - \tau_b^2)\cos\phi_b}$$

Rearranging the equation (13) by substituting the equation (11) thereinto, the following equation is obtained.

$$E_3(T_{ret}) = 0$$

Hence, the proposition has been demonstrated.

Accordingly, if $L_1$, $C_1$, $L_3$ and $C_3$ are selected substantially to satisfy the equation (11), the energy remaining in $L_3$ and $C_3$ is almost eliminated just after the retracing operation, resulting in that there is attained an advantage that harmful ringing vibration can be reduced during the scanning period continued from the retracing operation.

It is considered that the condition of the equations (11) is approximated after substituting the equation (7) thereinto.

$$\frac{T_{ret}}{\tau_a} = \pi + 2\phi_a = \pi + \tan^{-1}\frac{T_{cc}\tau_a}{L_1 i_1}$$

When the scanning period is represented by $T_s$, the current I changes from $+i_1$ to $-i_1$ during the scanning period $T_s$. Accordingly, the following equation is established.

$$E_{cc}T_s = 2L_1 i_1 \quad (14)$$

On the other hand, $\tau_a$ is sufficiently smaller than $T_s$. Accordingly, the following approximation is established.

$$\frac{T_{ret}}{\tau_a} \approx \pi + \frac{2\tau_a}{T_s} \quad (15)$$

Similarly, the following approximation is established.

$$\frac{T_{ret}}{\tau_b} \approx 3\pi + \frac{2\tau_b}{T_s} \quad (16)$$

Hence, analysis is terminated and followed by synthesis. With $T_s$ and $T_{ret}$ as given conditions, the following approximate expressions for $\tau_a$ and $\tau_b$ are obtained from the equations (15) and (16).

$$\begin{cases} \tau_a \approx \dfrac{T_{ret}}{\pi + \dfrac{2}{\pi}d} \\ \tau_b \approx \dfrac{T_{ret}}{3\pi + \dfrac{2}{3\pi}d} \end{cases} \quad (17)$$

where $d = T_{ret}/T_s \ll 1$.

On the other hand, when the amplitude ratio of the tertiary wave (second term) to the fundamental wave (first term) is represented by k, k can be approximated as follows.

$$k = \frac{(\tau_b^2 - \tau_3^2)}{\tau_b(\tau_b^2 - \tau_a^2)\cos\phi_b} \times \frac{\tau_a(\tau_a^2 - \tau_b^2)\cos\phi_a}{(\tau_a^2 - \tau_3^2)} \approx \quad (18)$$

$$3\frac{\tau_3^2 - \tau_b^2}{\tau_a^2 - \tau_3^2} \approx 3\frac{\tau_3^2 - \left(\dfrac{\tau_a}{3}\right)^2}{\tau_a^2 - \tau_3^2}$$

$$\therefore \begin{cases} \dfrac{\tau_a}{\tau_b} \approx 3 \quad \because \text{expressions (17)} \\ \cos\phi_a \approx 1, \cos\phi_b \approx 1 \end{cases}$$

Reversely, $t_3$ can be obtained from the expression (18). The amplitude ratio to establish the value of k to be about 1/6 is as follows.

$$\left(\frac{\tau_3}{\tau_a}\right)^2 \approx \frac{k + \frac{1}{3}}{k + 3} \quad (19)$$

$$= \frac{3}{19} \quad (20)$$

With the scanning period $T_s$ and the retract period $T_{ret}$ as given conditions, $\tau_a$ and $\tau_b$ are determined from the expressions (17). Further, with the amplitude ratio k as a given condition, $\tau_3$ is determined from the expression (19). Accordingly, the relations of $L_1$, $1/C_1$, $L_3$ and $1/C_3$ can be singly determined by solving the following equations which express the relations of the equations (4)' by relations between roots and coefficients.

$$\tau_a^2 \tau_b^2 = \tau_1^2 \tau_3^2 = L_1 C_1 L_3 C_3 \quad (21)$$

$$\tau_a^2 + \tau_b^2 = \tau_1^2 + \tau_{13}^2 + \tau_3^2 \quad (22)$$
$$= L_1 C_1 + L_1 C_3 + L_3 C_3$$

$$\left(\frac{\tau_3}{\tau_a}\right)^2 = \frac{k + \frac{1}{3}}{k + 3} \quad (19)$$

The equation (19) is substituted into the equation (21) to obtain $\tau_1$ as follows.

$$L_1 C_1 = \tau_1^2 = \left(\frac{\tau_a \tau_b}{\tau_3}\right)^2 \quad (23)$$
$$= \tau_b^2 \frac{k + \frac{1}{3}}{k + 3}$$

If the inductance $L_1$ of the deflection coil is decided, the resonant capacitor $C_1$ and $\tau_1$ are obtained from the equation (23). Because $\tau_3$ has been obtained from the equation (19), $\tau_{13}$ can be obtained by substituting these values into the equation (22). Accordingly, $C_3$ ($\tau_{13}^2/L_1$) can be obtained. Accordingly, $L_3$ ($\tau_3^2/C_1$) can be obtained. Consequently, each value can be determined.

Although the above description has been established on the tertiary harmonic mode, the aforementioned equations can be applied to the case where n=2 is used in the (4n−1)-th harmonic mode, that is to the seventh harmonic mode. In this case, each value can be obtained similarly by replacing $3\pi$ with $7\pi$ in the equations (11), (16) and (17).

The figure of merit (FM) in the tertiary harmonic resonance mode, in the case where the amplitude ratio k of the tertiary wave to the fundamental wave is established to be 1/6, can be expressed quantitatively as follows. In accordance with the equation (2), $$FM = \frac{2L_1 i_1}{V_{0p} \times T_{ret}} \quad (2)$$

$$V_{0p} \equiv E\left(\frac{T_{ret}}{2}\right) - E_{cc}$$

Rearranging the given equation by substituting the equations (6) and (11) thereinto, the following equation is obtained finally (detailed process is omitted).

$$FM \approx \frac{2}{\pi} \times \frac{1 + \frac{k}{3}}{1 - k} \quad (24)$$

$$= \frac{2}{\pi} \times \frac{1 + \frac{1}{18}}{1 - \frac{1}{6}} = \frac{2}{\pi} \times 1.27 \quad (25)$$

It is apparent from comparison with the aforementioned equation (3) expressing the case of single-tuned resonance that the figure of merit (FM) is improved by 1.27 times. The details of such an improvement effect are shown in the equation (24). In short, (1−k) in the denominator means the effect of reducing $V_{op}$ and (1+k/3) in the numerator means the effect of increasing the area (total magnetic flux) surrounded by the flyback pulse in FIG. 2.

Although it may be judged from the appearance of the equation (24) that the effect of improvement increases as the ratio k of the tertiary wave increases, the value for k is, in fact, limited. If k is established to be ½ or more, the effect of improvement reversely deteriorates because the waveform of the pulse of FIG. 2 has two large peaks. For this reason, the equation (24), which is obtained by using $V_{op}$ as a center value of the pulse, can be established only in the case where the value of k is about 1/6 or less. Also if the k value is established to be too large, the energy of the additional inductor 6 of FIG. 1 is increased and, accordingly, the size thereof is undesirably enlarged. Accordingly, the value of k for general purposes is established to be not more than ⅓.

The description of the fundamental embodiment is terminated. In the following, the second embodiment of the present invention is described with reference to FIG. 7, in which the numerals 1 to 6 refer to like parts identified by the numerals of FIG. 1.

Figure 7:
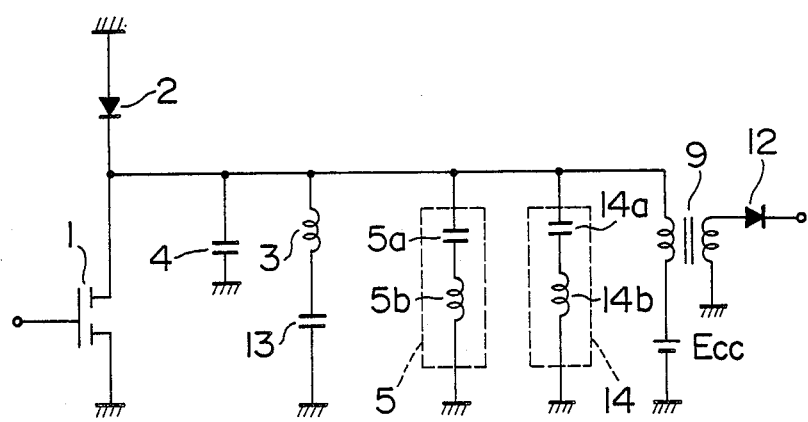
FIG. 7 is a circuit diagram showing a second embodiment of the present invention.

In FIG. 7, the reference numeral 9 designates a flyback transformer and 12 a high-voltage rectifier diode. The reference numeral 13 designates a bypass capacitor for preventing a direct current from flowing in the deflection coil. The reference numerals 14a and 14b designate a capacitor and an inductor which, for example, perform resonance substantially to the seventh harmonic component. This case corresponds to the case of n=n+1.

In this embodiment, a second series resonant circuit 14 formed by the series arrangement of the capacitor 14a and the inductor 14b is connected in parallel with the resonant capacitor 4. According to this embodiment, the first series resonant circuit 5 (tertiary frequency resonance) and the second series resonant circuit 14 (seventh frequency resonance) respectively perform composite resonance in combination with the resonant capacitor 4, resulting in that the top portion of the flyback pulse is more flattened. Accordingly, the waveform of the flyback pulse becomes nearer the form of rectangular wave, so that the figure of merit (FM) becomes closer to 1.

It is a matter of course that the figure of merit (FM) becomes further closer to 1 if a higher-order frequency resonant circuit is connected in parallel with the resonant capacitor 4.

According to the present invention, the product of the peak value of the voltage amplitude of the horizontal retrace pulse and the horizontal retrace period can be reduced by about 20% or more compared with the prior art. Accordingly, the circuit can be more improved in the capacity of deflection by use of parts, such as a horizontal transfer, a damper diode and a deflection coil, having limited performance. The "capacity of deflection" used herein means the capacity of deflecting an electron beam.

In addition, according to the invention, the circuit can be more improved in environmental durability and reliability by use for the same purpose. Consequently, the invention has a high industrial value.

We claim:

1. A horizontal deflection circuit to be used for a CRT, comprising:
    a horizontal output transistor;
    a damper diode connected in parallel with said horizontal output transistor;
    a resonant capacitor connected in parallel with said damper diode;
    a horizontal deflection coil connected in parallel with said horizontal output transistor; and
    a series resonant means constituted by a series connection of a capacitor means and an inductor means and connected in parallel with said resonant capacitor so as to perform composite resonance in a retrace period in cooperation with said resonant capacitor and said deflection coil.

2. A horizontal deflection circuit according to claim 1, wherein said composite resonance comprises a first component and a second component, a time constant of the first component being substantially equal to a retrace time $T_s$ divided by $\pi$, a time constant of the second component being substantially equal to $T_s/3\pi$, a current amplitude ratio of the second component versus the first component being in a range of ⅓ to a predetermined lower value.

3. A horizontal deflection circuit according to claim 1, wherein said composite resonance enables a top of a flyback pulse to be flattened such that the waveform of said flyback pulse becomes substantialy similar to a rectangular wave, thereby enabling said horizontal deflection circuit to increase a retrace capacity through said horizontal output transistor.

* * * * *